(12) United States Patent
Zang et al.

(10) Patent No.: US 12,261,230 B2
(45) Date of Patent: Mar. 25, 2025

(54) SINGLE PHOTON AVALANCHE DIODE AND MANUFACTURING METHOD, DETECTOR ARRAY, AND IMAGE SENSOR

(71) Applicant: Shenzhen Adaps Photonics Technology Co. LTD., Shenzhen (CN)

(72) Inventors: Kai Zang, Shenzhen (CN); Shuang Li, Shenzhen (CN); Zhijie Ma, Shenzhen (CN)

(73) Assignee: Shenzhen Adaps Photonics Technology Co. LTD., Shenzhen (CN)

( * ) Notice: Subject to any disclaimer, the term of this patent is extended or adjusted under 35 U.S.C. 154(b) by 873 days.

(21) Appl. No.: 17/346,132

(22) Filed: Jun. 11, 2021

(65) Prior Publication Data
US 2021/0305440 A1    Sep. 30, 2021

Related U.S. Application Data

(63) Continuation of application No. PCT/CN2019/105778, filed on Sep. 12, 2019.

(30) Foreign Application Priority Data

Dec. 13, 2018    (CN) .......................... 201811524540.4

(51) Int. Cl.
*H01L 31/02*     (2006.01)
*H01L 27/146*    (2006.01)
*H01L 31/0232*   (2014.01)

(52) U.S. Cl.
CPC .... *H01L 31/02027* (2013.01); *H01L 27/1464* (2013.01); *H01L 27/14643* (2013.01); *H01L 27/14685* (2013.01); *H01L 31/02327* (2013.01)

(58) Field of Classification Search
CPC ......... H01L 31/02027; H01L 31/02327; H01L 27/1464; H01L 27/14643; H01L 27/14685
See application file for complete search history.

(56) References Cited

U.S. PATENT DOCUMENTS 7,733,567 B2 *  6/2010  Li .......................... G02B 1/118
                                                      359/620
9,209,320 B1   12/2015  Webster
(Continued)

FOREIGN PATENT DOCUMENTS

CN     105097856 A    11/2015
CN     106057957 A    10/2016
(Continued)

OTHER PUBLICATIONS

Extended European Search Report for related application EP 19895071.9, mailed Jan. 12, 2022.
(Continued)

*Primary Examiner* — Peniel M Gumedzoe

(57) ABSTRACT

A single-photon avalanche diode and a manufacturing method thereof, a detector array, and an image sensor are disclosed. The back-side illuminated single-photon avalanche diode is disposed with a light-trapping structure and a sidewall reflection wall. Incident light is reflected, scattered, and refracted by the light-trapping structure and then dispersed to various angles, and with the addition of the reflection effect of the sidewall reflection wall, the effective optical path of the light in the back-side illuminated single-photon avalanche diode can be extended. The manufacturing method of a back-side illuminated single-photon avalanche diode achieves the manufacturing of the back-side illuminated single-photon avalanche diode. For the photoelectric detector array and the image sensor including the back-side illuminated single-photon avalanche diode, since they have the back side illumination single-photon avalanche diode, (Continued)

light absorption efficiencies of the photoelectric detector array and the image sensor are effectively improved.

17 Claims, 17 Drawing Sheets

(56) References Cited

U.S. PATENT DOCUMENTS

| | | | |
|---|---|---|---|
| 2005/0047312 A1* | 3/2005 | Yamanaka | G11B 7/1353 |
| 2011/0042647 A1 | 2/2011 | Choi | |
| 2014/0339398 A1* | 11/2014 | Mazzillo | H01L 31/02327 |
| | | | 250/208.2 |
| 2015/0340391 A1 | 11/2015 | Webster | |
| 2018/0069043 A1 | 3/2018 | Pan et al. | |
| 2018/0090526 A1 | 3/2018 | Mandai et al. | |

FOREIGN PATENT DOCUMENTS

| | | |
|---|---|---|
| CN | 106129169 A | 11/2016 |
| CN | 106298816 A | 1/2017 |
| CN | 109659377 A | 4/2019 |
| CN | 209216990 U | 8/2019 |

OTHER PUBLICATIONS

International Search Report for PCT/CN2019/105778 mailed Nov. 27, 2019.

* cited by examiner

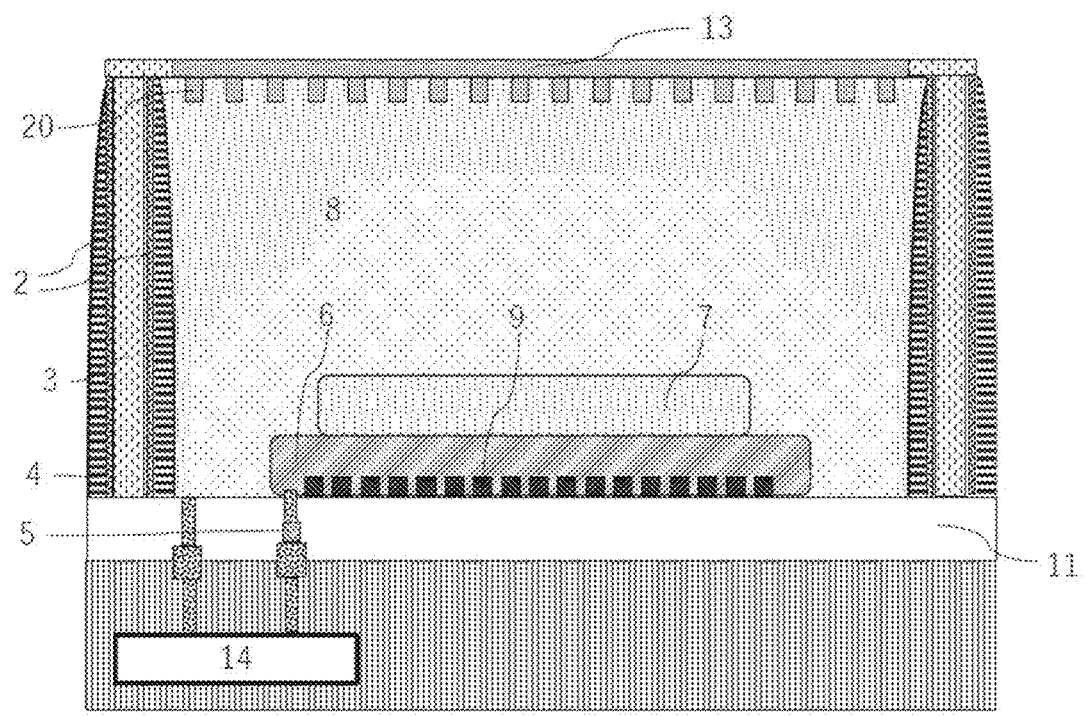
FIG. 12
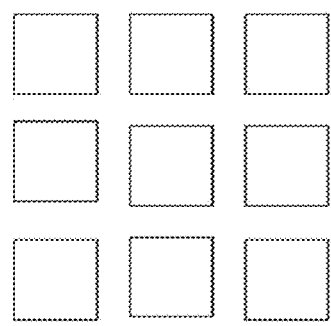 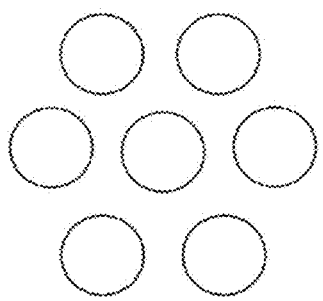 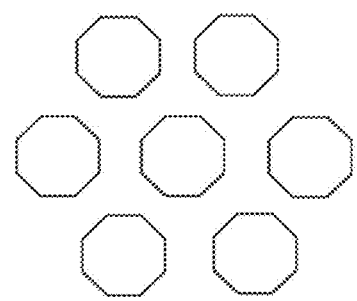
FIG. 13A  FIG. 13B  FIG. 13C

SINGLE PHOTON AVALANCHE DIODE AND MANUFACTURING METHOD, DETECTOR ARRAY, AND IMAGE SENSOR

CROSS-REFERENCES TO RELATED APPLICATIONS

The present application is a bypass continuation application of International Patent Application No. PCT/CN2019/105778, entitled "SINGLE-PHOTON AVALANCHE DIODE AND MANUFACTURING METHOD, DETECTOR ARRAY, AND IMAGE SENSOR", filed on Sep. 12, 2019, which claims priority to Chinese Patent Application No. CN201811524540.4, filed on Dec. 13, 2018, and both applications are commonly owned and incorporated by reference herein for all purposes.

BACKGROUND

Image sensors are widely used in various electronic devices, such as a digital camera, a mobile phone, a medical imaging device, a security inspection device, a distance measuring camera, and the like. With the development of semiconductor technology for manufacturing image sensors, the image sensors have been further developed towards low-power consumption, miniaturization, and high integration. The image sensor is typically made up of an array of photoelectric detectors. A single-photon avalanche diode (SPAD) is a photoelectric detector that can be used in the image sensor.

SUMMARY

The present disclosure is intended to address at least one of the technical problems of the related art to some extent. Therefore, the purpose of the present disclosure is to provide a back-side illuminated single-photon avalanche diode and a manufacturing method thereof, thereby improving the light absorption efficiency.

Therefore, a second purpose of the present disclosure is to provide a photoelectric detector array, and an image sensor, thereby improving the light absorption efficiencies of the array and the sensor.

The technical solution adopted by the present disclosure is as follows.

In a first aspect, the present disclosure provides a back-side illuminated (BSI) single-photon avalanche diode having a substrate, a circuit layer, a silicon oxide layer, and a silicon detection layer disposed sequentially from bottom to top. The silicon detection layer includes a first type doped region, a second type doped region, a third type doped region, and a sidewall reflection wall. The second type doped region or the third type doped region forms a SPAD junction with the first type doped region. The third type doped region is a doped region having a varied doping concentration, and a light-trapping structure is disposed in the back-side illuminated single-photon avalanche diode.

Further, an anti-reflection structure is disposed on an upper surface of the back-side illuminated single-photon avalanche diode.

Further, the anti-reflection structure is a film structure disposed above the silicon detection layer, and the film structure includes at least two types of films having different refractive indices.

Further, the light-trapping structure and/or the anti-reflection structure are inverted pyramid structures.

Further, the light-trapping structure is disposed on an upper surface of the back-side illuminated single-photon avalanche diode and/or above the silicon oxide layer and/or below the silicon oxide layer.

Further, the first type doped region is disposed above the silicon oxide layer, and the light-trapping structure is disposed in the first type doped region.

Further, the back-side illuminated single-photon avalanche diode further includes a microlens disposed above the silicon detection layer.

Further, the second type doped region is disposed above the first type doped region, the third type doped region includes the second type doped region, and the third type doped region has a doping concentration increased from bottom to top.

Further, the first type doped region is an n-type doped region, and the second type doped region and the third type doped region are p-type doped regions; or the first type doped region is an p-type doped region, and the second type doped region and the third type doped region are n-type doped regions.

Further, the light-trapping structure includes nano-scale or micron-scale concave-convex structures.

Further, the concave-convex structures are distributed in a manner including a tetragonal close-up distribution, a hexagonal close-up distribution, or a random distribution.

Further, the sidewall reflection wall is a deep trench isolation structure, the deep trench isolation structure extends through the silicon detection layer in a thickness direction, and the deep trench isolation structure performs back and forth reflections on an incoming light ray.

Further, the deep trench isolation structure is filled with silicon oxide, amorphous silicon, polysilicon, or metal.

Further, the back-side illuminated single-photon avalanche diode further includes at least two external electrodes for reading out signals and/or applying voltages, and the external electrodes are connected to the silicon detection layer.

Further, the back-side illuminated single-photon avalanche diode includes a first external electrode, a second external electrode, and a quenching resistor, the first external electrode is electrically connected to the first type doped region through the quenching resistor, and the second external electrode is electrically connected to the third type doped region; or the first external electrode is electrically connected to the third type doped region through the quenching resistor, and the second external electrode is electrically connected to the first type doped region.

Further, the back-side illuminated single-photon avalanche diode includes a first external electrode, a second external electrode, and a quenching resistor, the first external electrode is electrically connected to the first type doped region, and the second external electrode is electrically connected to the third type doped region through the quenching resistor; or the first external electrode is electrically connected to the third type doped region, and the second external electrode is electrically connected to the first type doped region through the quenching resistor.

Further, the back-side illuminated single-photon avalanche diode includes a first external electrode, a second external electrode, and a quenching resistor, the deep trench isolation structure is filled with amorphous silicon, polysilicon, or metal, the first external electrode is electrically connected to the first type doped region through the quenching resistor, and the second external electrode is electrically connected to the deep trench isolation structure; or the first external electrode is electrically connected to the deep trench isolation structure through the quenching resistor, and the second external electrode is electrically connected to the first type doped region.

Further, the back-side illuminated single-photon avalanche diode includes a first external electrode, a second external electrode, and a quenching resistor, the deep trench isolation structure is filled with amorphous silicon, polysilicon, or metal, the first external electrode is electrically connected to the first type doped region, and the second external electrode is electrically connected to the deep trench isolation structure through the quenching resistor; or the first external electrode is electrically connected to the deep trench isolation structure, and the second external electrode is electrically connected to the first type doped region through the quenching resistor.

In a second aspect, the present disclosure provides a photoelectric detector array, which includes a plurality of the described back-side illuminated single-photon avalanche diodes distributed in an array.

In a third aspect, the present disclosure provides an image sensor, which includes a control circuit, a readout circuit, and a plurality of the described back-side illuminated single-photon avalanche diodes. An output end of the control circuit is connected to an input end of the back-side illuminated single-photon avalanche diode, and an output end of the back-side illuminated single-photon avalanche diode is connected to an input end of the readout circuit.

In a third aspect, the present disclosure provides a manufacturing method of a back-side illuminated single-photon avalanche diode, applied to the back-side illuminated single-photon avalanche diode. The manufacturing method includes the following steps:

manufacturing a photodiode on a silicon wafer to obtain a first wafer, a first light-trapping structure being disposed on one surface of the photodiode;
   aligning and bonding a surface of the first wafer 16 close to the photodiode and a surface of the second wafer close to an external circuit, the external circuit being disposed in the second wafer;
   abrading and etching the silicon wafer of the first wafer to reduce its thickness; and
   manufacturing a second light-trapping structure on the silicon wafer.

The advantageous effects of the present disclosure are as below.

The back-side illuminated single-photon avalanche diode of the present disclosure is provided with a light-trapping structure and a sidewall reflection wall. Incident light is reflected, scattered, and refracted by the light-trapping structure and then dispersed to various angles, and with the addition of the reflection effect of the sidewall reflection wall, the effective optical path of the light in the back-side illuminated single-photon avalanche diode can be extended, thereby improving the absorption efficiency of the light in the back-side illuminated single-photon avalanche diode without increasing the thickness of the device, and overcoming the technical problem of low light absorption efficiency of SPAD in the prior art. In addition, the manufacturing method of a back-side illuminated single-photon avalanche diode achieves the manufacturing of the back-side illuminated single-photon avalanche diode, where the back-side illuminated single-photon avalanche diode has a first light-trapping structure and a second light-trapping structure, so that light absorption efficiency of the back-side illuminated single-photon avalanche diode can be improved. For the photoelectric detector array and the image sensor including the back-side illuminated single-photon avalanche diode, since they have the back-side illuminated single-photon avalanche diode, light absorption efficiencies of the photoelectric detector array and the image sensor are improved.

In addition, the anti-reflection structure is further disposed on the upper surface of the back-side illuminated single-photon avalanche diode to improve the light transmittance of the light ray, reduce the refractive index of the light ray, and increase the number of light rays entering the back-side illuminated single-photon avalanche diode, thereby further improving the light absorption efficiency thereof.

One general aspect of certain embodiments provides a back-side illuminated (BSI) SPAD pixel circuit. The BSI SPAD pixel circuit includes a substrate material, a first sidewall structure and a second sidewall structure, a diffraction grating structure configured on the substrate material, a first doped region overlaying the diffraction grating structure. The first doped region may include a first top surface region and a second top surface region. The BSI SPAD pixel circuit may further include a second doped region overlaying the first top surface region of the first doped region. The second doped region may include a third top surface region. The BSI SPAD pixel circuit may also include a third doped region overlaying the second top surface region of the first doped region and the third top surface region of the second doped region. The third dope region is positioned between the first sidewall structure and the second sidewall structure. The BSI SPAD pixel circuit may further include a light-trapping structure overlaying the third doped region.

In various embodiments, the diffraction grating structure is configured to increase reflection of light wavelengths between 850 nm and 960 nm. The first doped region is characterized by a larger surface than the second doped region. The third doped region is characterized by a concentration gradient. The light-trapping structure may include an anti-reflection structure configured to increase light absorption. The circuit may include a SPA) region configured at a junction between the first doped region and the second doped region. The circuit may include a silicon oxide layer configured between the diffraction grating structure and the substrate material. The circuit may include a silicon oxide layer configured between the diffraction grating structure and the first doped region. The diffraction grating structure is substantially reflective. The light-trapping structure may include diffraction grating elements. The first sidewall structure may include a deep trench isolation structure. The first sidewall structure may include a reflective surface. The circuit may include a contact structure and a circuit layer configured within the substrate material.

Another general aspect of certain embodiments includes a method for manufacturing a BSI SPAD array. The method includes providing a first wafer, forming a plurality of SPAD regions separated by isolation structures. The plurality of SPA) regions may include a front side and a back side. The method may further include forming a plurality of diffraction grating structures on the front side, forming a substrate overlaying the plurality of diffraction grating structures. The substrate may include a contact structure. The method may also include forming a light-trapping structure on the front side.

According to various embodiment, the method for manufacturing a BSI SPAD array may further include bonding a second wafer with the first wafer to form a bonded wafer. The second wafer may include an external circuit. The method may include turning over the bonded wafer.

Yet another general aspect of certain embodiments provides a back-side illuminated (BSI) SPAD pixel circuit, which includes a substrate material, a first sidewall structure, a diffraction grating structure configured on the substrate material, a silicon oxide layer coupled to the diffraction grating structure, a first doped region overlaying the diffraction grating structure. The first doped region may include a first top surface region and a second top surface region. The circuit may further include a second doped region overlaying the first top surface region of the first doped region, the second doped region may include a third top surface region. The circuit may further include a third doped region overlaying the second top surface region of the first doped region and the third top surface region of the second doped region. In some embodiments, the circuit may also include a light-trapping structure overlaying the third doped region.

In various embodiments, the BSI SPAD pixel circuit may include a SPAD region configured at a junction between the first doped region and the second doped region. The first sidewall structure may include a deep trench isolation structure. The first sidewall structure is substantially reflective.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

FIG. 12 is a schematic diagram illustrating a cross-section of a back-side illuminated single-photon avalanche diode according to a specific embodiment of the present disclosure.

FIGS. 13a, 13b, and 13c are schematic diagrams illustrating a shape and an arrangement of a light-trapping structure of a back-side illuminated single-photon avalanche diode according to a specific embodiment of the present disclosure.

In these drawings: A—time control circuit; B—SPAD detection array; C—excitation light source; D—lens; E—object; F—pulse signal; G—top wafer; H—bottom wafer; I—back-side illuminated SPAD array; J—control circuit; K—readout circuit; L—quenching resistor; 201—filter; 202—metal conducting wire; 203—light receiving layer; 204—substrate; 205—photodiode; 206—deep trench isolation structure; 41—deep trench isolation structure; 42—p type doped; 43—n type doped; 44—quenching resistor; 45—oxide bonding layer; 46—through hole; 47—metal line; 48—concentration gradient p type doped; 49—insulating medium protective layer; 410—external access circuit; 1—inverted pyramid structure; 2—oxide layer; 3—filled cavity; 4—fourth type doped region; 5—quenching resistor; 6—first type doped region; 7—second type doped region; 8—third type doped region; 9—diffraction grating light-trapping structure; 10—carrier silicon substrate; 11—silicon oxide layer; 12—SPAD junction; 13—insulating medium protective layer; 14—external access circuit; 15—metal line; 16—first wafer; 17—first external electrode; 18—second external electrode; 19—anti-reflection film; 191—first film material; 192—second film material; 20—shallow trench structure; and 21—microlens.

DETAILED DESCRIPTION

It should be noted that embodiments in the present disclosure and features in the embodiments can be combined with each other under the premise of no conflict.

The single-photon avalanche diode (SPAD) can be used in a variety of industrial and academic applications, such as deep detection (including lidar), medical sensing, machine vision, gesture recognition, quantum science, and the like. Its applications include a single SPAD, a silicon photo multiplier (SiPM), and an array of SPADs. For the SPAD, since its single single-photon detector (SPAD) is a binary device with only two states of "output signal" and "no output signal". In order to measure an intensity signal of light, the following two typical representations are used in the field of deep detection such as lidar:

(1) Silicon Photo Multiplier (SiPM): The SiPM includes a plurality of SPAD sub-units, and output terminals (ports) of all the SPAD sub-units are connected in parallel as a whole to output a signal. Since there is a plurality of SPAD sub-units, identification of signal light intensity can be realized.

Figure 1:
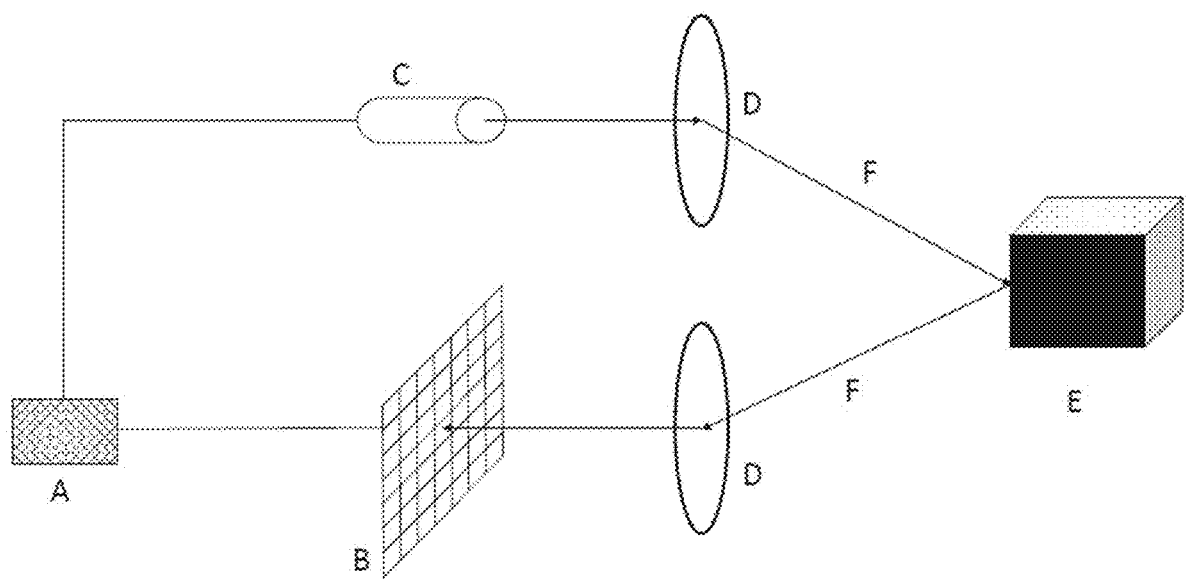
FIG. 1 is a schematic diagram illustrating a lidar ranging.

(2) SPAD array: Each SPAD in the SPAD array is output as a single pixel, so that an image can be generated directly, which is applicable to a flash lidar. The application of single-photon detector in lidars has great potential, the application scenario thereof is shown in FIG. 1. A pulse signal F or a modulated signal emitted by a laser source C passes through a lens D and then is reflected by an object to be measured, and then is received by a SPAD detection array B. A time control circuit A can accurately calculate a distance from the object to be measured according to a time interval between emission and reception of the signal.

Figure 2:
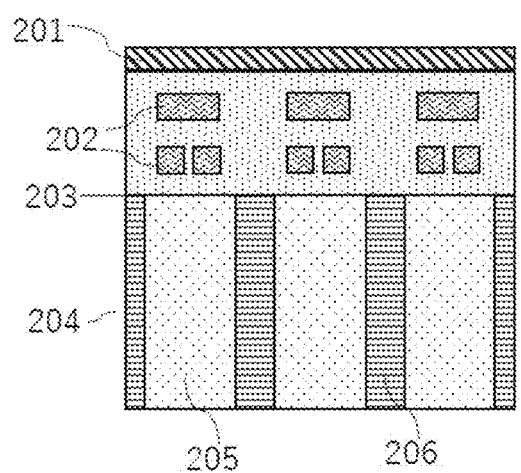
FIG. 2 is a schematic diagram illustrating a cross-section of a front-side illuminated image sensor.

A cross-section view of a front-side illuminated image sensor is shown in FIG. 2. According to optics theories, since a processing circuit is located above a silicon detection layer, an incident light needs to pass through a circuit layer filled with metal conducting wires 202 and a dielectric material before reaching the silicon detection layer (that is, photodiodes 205), and the incident light is absorbed or scattered, resulting in inefficient light detection. In addition, since a quenching circuit and a charging circuit of each SPAD unit occupy a relatively large area, a filling factor of the SPAD unit is very low. When introducing other functions, such as counting, sampling, compression, and the like, to the circuit of the SPAD unit, the problem of the low filling factor becomes more serious; the low filling factor results in a decrease in detection efficiency of the silicon photo multiplier (SiPM) or the SPAD array.

Figure 3:
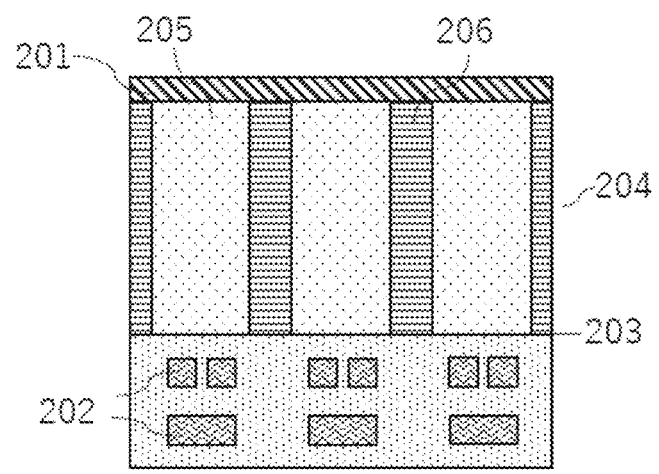
FIG. 3 is a schematic diagram illustrating a cross-section of a back-side illuminated image sensor.
Figure 4:
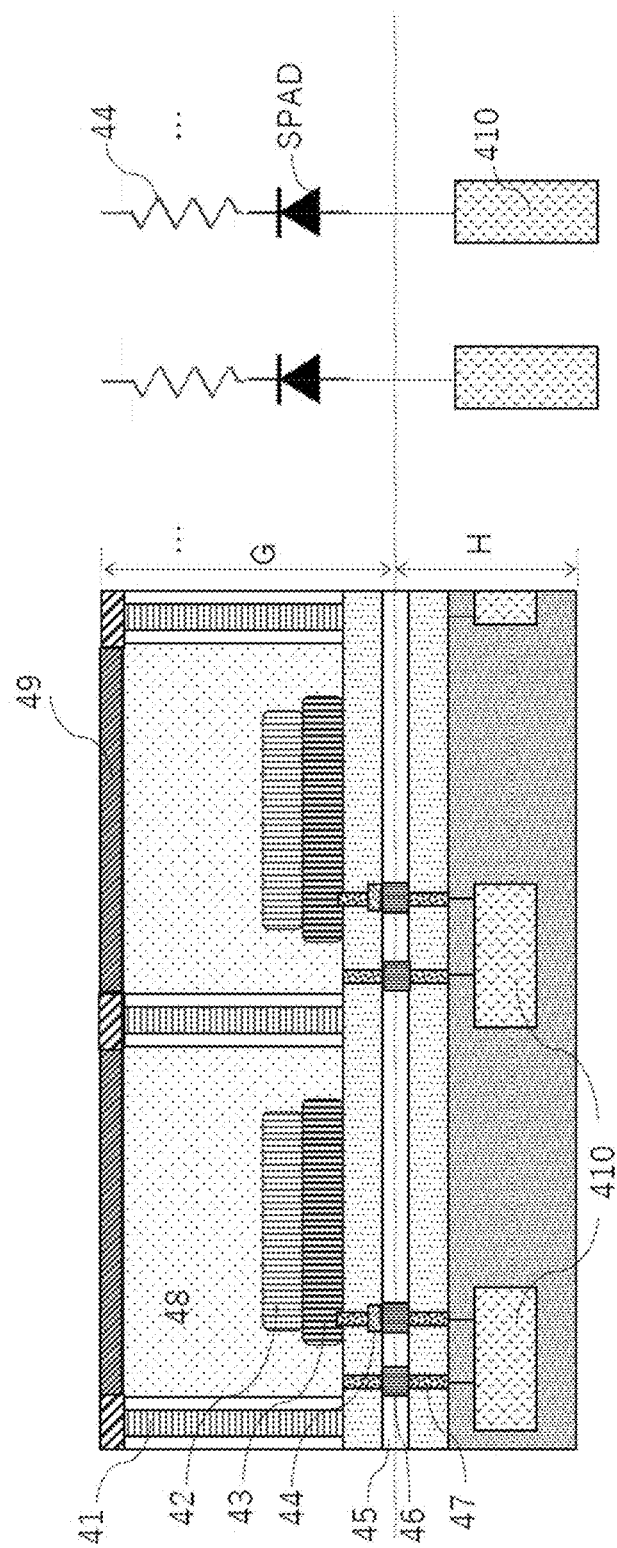
FIG. 4 is a schematic diagram illustrating a specific cross-section of a back-side illuminated SPAD.

A cross-section view of a back-side illuminated image sensor is shown in FIG. 3. The back-side illuminated (BSI) image sensor is a design in which the circuit layer is placed under the detection layer, that is, the photodiodes 205 are located above the circuit layer. A cross-section view of the back-side illuminated SPAD is shown in FIG. 4. A left half portion of FIG. 4 illustrates a specific structure of the back-side illuminated SPAD, and a right half portion of FIG. 4 is an equivalent schematic diagram of the SPAD. Where, a top wafer G includes a back-side illuminated SPAD array, an external access circuit 410 is located in a bottom wafer H, the external circuit 410 includes a bias supply circuit or a signal processing circuit. The top wafer G and the bottom wafer H are connected through an oxide bonding layer 45, and the metal lines 47 are precisely aligned and connected through the through-holes 46. It has the following advantages compared to the front-side illuminated SPAD: 1) the incident light directly reaches the detection layer so that the absorption efficiency is improved; 2) the deep trench isolation structures 41 between the units can reduce the occurrence of crosstalk; 3) the circuit is disposed in the lower layer, the filling factor of the photosensitive area of the SPAD is increased, and therefore allowing for circuits with more complicated structure; 4) contamination caused by the metal material in the process flow is avoided; 5) the area of the pixel unit is smaller so that the number of pixels per unit area is higher, the imaging resolution is improved, allowing for SPAD array with millions of pixels; and 6) since the detection layer is close to the microlens (typically disposed on a surface of the SPAD), a microlens having a larger numerical aperture can be used in the BSI SPAD to improve the collection of light incident at a large angle.

However, SPAD has the following disadvantages.

(1) The silicon material has a low absorptivity for light at a wavelength of 800-1000 nm. The current SPAD employs a planar structure in which photons enter a device layer vertically and propagate vertically, and the absorption efficiency of the photons is positively related to a thickness of the device layer (specifically, a law of $1-e^{-\alpha L}$ is followed, where $\alpha$ is the absorption efficiency and L is an absorption distance), so that the light absorptivity can be increased by increasing the thickness. However, an excessively thick device layer requires a corresponding increase in the area of the SPAD, thereby reducing the number of units per unit area. In addition, manufacturing of the excessively thick device layer is difficult, the yield is low, and it is not easy to be compatible with the CMOS process, and the cost is increased. In addition, the use of thick silicon increases the jitter time of the SPAD, thus reducing the accuracy of distance detection in lidar and/or other time-of-flight-based applications.

(2) By adding an anti-reflection film to a surface of the planar structure of the SPAD, the incidence rate of light is increased. But the anti-reflection effect decreases with the increase of the incidence angle, resulting in a decrease in the absorption efficiency of the incident photons.

(3) For a SPAD imaging array, the angle of incident light converged through a lens received by the units located at edge locations of the array is relatively large, which may result in a decrease in the absorption efficiency.

(4) In the planar BSI SPAD, for certain wavelengths, the silicon layer can act as a resonant cavity so that its absorption efficiency reaches a very high value at certain wavelengths. However, this method has many disadvantages: 1) when an actual processing thickness of the silicon layer deviates slightly from a designed one, the resonance frequency is shifted; 2) it is very sensitive to the wavelength of the incident light, and the absorption efficiency is significantly decreased for light deviating from the resonance frequency; 3) when the temperature changes, a slight change in the refractive index of the material also causes a shift in the resonance frequency; and 4) it is very sensitive to changes of the angle of incident light.

Example One

A back-side illuminated single-photon avalanche diode has a substrate, a circuit layer, a silicon oxide layer, and a silicon detection layer disposed sequentially from bottom to top. The silicon detection layer includes a first type doped region, a second type doped region, a third type doped region, and a sidewall reflection wall. The second type doped region or the third type doped region forms a SPAD junction with the first type doped region. The third type doped region is a doped region that has a varied doping concentration. The back-side illuminated single-photon avalanche diode is further provided with a light-trapping structure. Further, an anti-reflection structure is further disposed on an upper surface of the back-side illuminated single-photon avalanche diode.

Figure 5:
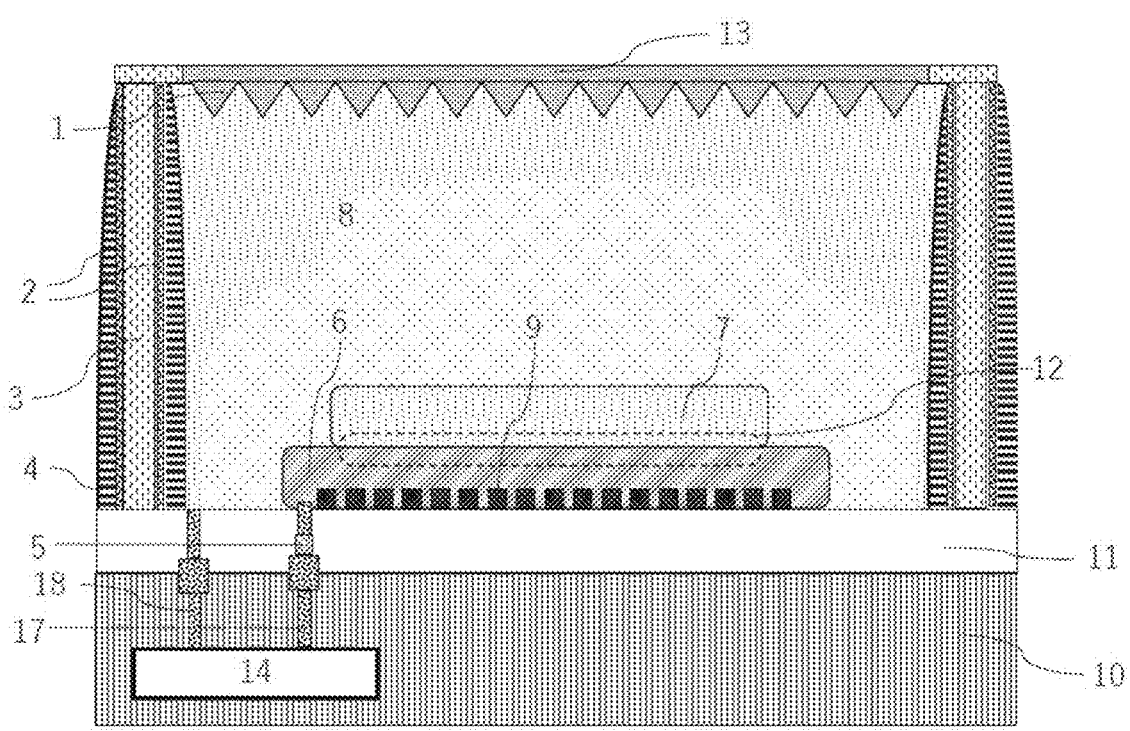
FIG. 5 is a schematic diagram illustrating a cross-section of a back-side illuminated single-photon avalanche diode according to a first embodiment of the present disclosure.

Since the back-side illuminated single-photon avalanche diode is provided with the light-trapping structure and/or the sidewall reflection wall, incident light can be reflected, scattered, and/or refracted through the light-trapping structure and can be dispersed to various angles, and in combination with the reflection effect of the sidewall reflection wall, the effective optical path of the light in the back-side illuminated single-photon avalanche diode can be extended. In this way, the absorption efficiency of the back-side illuminated single-photon avalanche diode for the Nearinfrared light can be significantly improved without increasing the thickness of the silicon layer, thereby overcoming the technical problem of low light absorption efficiency of SPAD existed in the prior art. The light absorption efficiency can be improved without increasing the thickness of the silicon layer, so that the jitter time will not be increased, and the processing difficulty, cost, and defective rate of the silicon wafer of the detector will not be increased. Further, in the present disclosure, the first type doped region is an n-type doped region, the second type doped region and the third type doped region are p-type doped regions, or the first type doped region is a p-type doped region, and the second type doped region and the third type doped region are n-type doped regions. Referring to FIG. 5, which is a schematic diagram illustrating a cross-section view of a back-side illuminated single-photon avalanche diode according to a first embodiment of the present disclosure. Further, the substrate is a carrier silicon substrate 10, the first type doped region 6 is disposed on the silicon oxide layer 11, the second type doped region 7 is disposed on the first type doped region 6 and forms a SPAD junction 12 (i.e., an avalanche region) with the first type doped region 6 at a junction between first type doped region 6 and second type doped region 7, and the third type doped region 8 is disposed on the second type doped region 7 and surrounds the first type doped region 6. In this way, the advantages of the back-side illuminated single-photon avalanche diode can be inherited, and the light absorption efficiency thereof can be further improved.

Example Two

An improvement has been further made based on Example One to obtain Example Two. The light-trapping structure is disposed on the upper surface of the back-side illuminated single-photon avalanche diode and/or above the silicon oxide layer and/or below the silicon oxide layer. The light-trapping structure on the upper surface, the light-trapping structure above the silicon oxide layer, or the light-trapping structure below the silicon oxide layer can be disposed individually to improve the light absorption efficiency of the back-side illuminated single-photon avalanche diode, or can be used in combination. Further, the light-trapping structure may include nano-scale or micron-scale concave-convex structures, for example, the light-trapping structure may include inverted pyramid structures 1 (see FIG. 10) or shallow trench structures 20 (as shown in FIG. 12, the shallow trench structures 20 are disposed on the upper surface of the SPAD), or a structure which has a honeycomb-shaped surface, a sinusoidal grating textured surface, a dimple-shaped ordered surface, a periodic pyramid structure surface, or a two-dimensional grating surface, or the like. The light-trapping structure may be made of a variety of insulating medium materials. In this example, it is made of silicon oxide. Referring to FIGS. 13a, 13b, and 13c, the concave-convex structure may have a shape of a square (for example, small square as shown in FIG. 13a), a circle (for example, circle as shown in FIG. 13b), or a polygon (for example, small octagon as shown in FIG. 13C). The concave-convex structures may be arranged in a uniform arrangement or a non-uniform arrangement (i.e., a random distribution). The uniform arrangement may be classified into a square-shaped closely-arranged distribution (for example, square-shaped distribution as shown in FIG. 13a) or a hexagonal-shaped closely-arranged distribution (for example, hexagonal-shaped distribution as illustrated in FIGS. 13b and 13c), and may be a nano-pillar array (as shown in FIGS. 13a and 13b) or a complementary nano-hole array (as shown in FIG. 13C).

Figure 6:
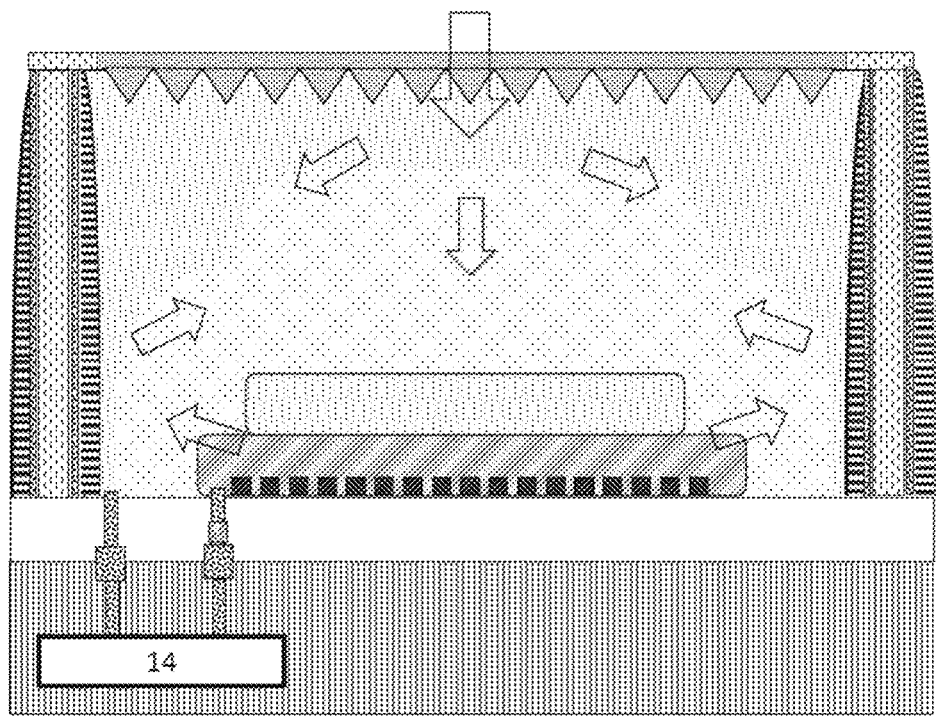
FIG. 6 is a schematic diagram illustrating an operating principle of the back-side illuminated single-photon avalanche diode of FIG. 5.
Figure 7:
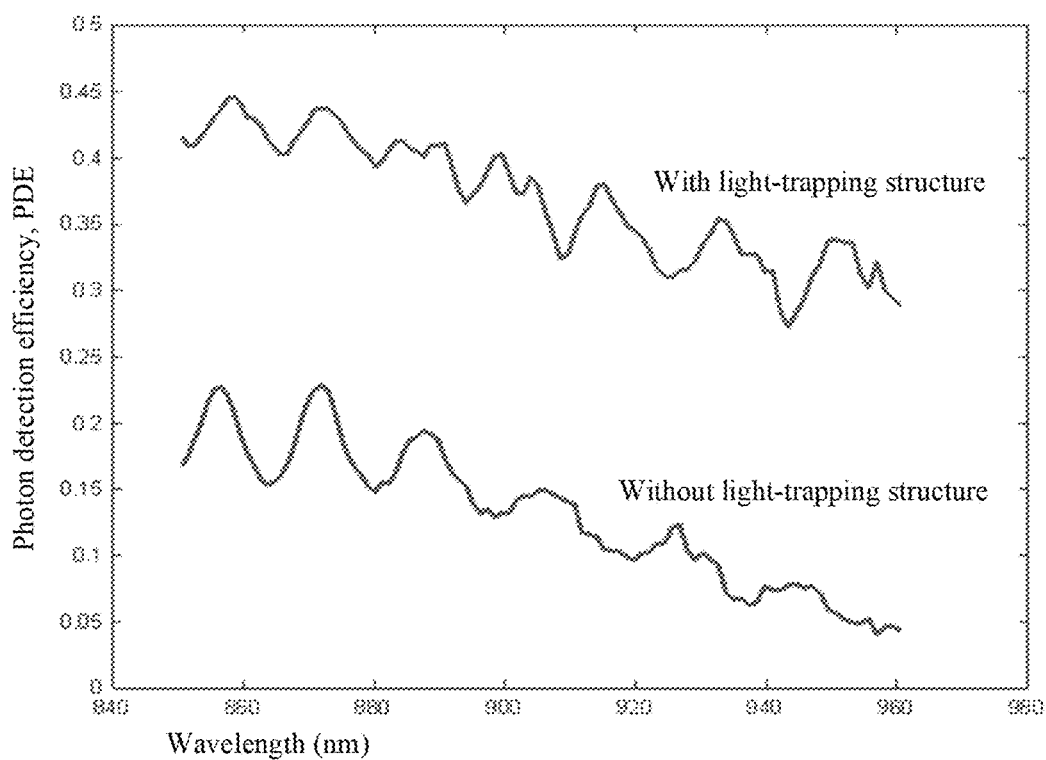
FIG. 7 is a schematic diagram illustrating photon detection efficiencies with and without a light-trapping structure.

Referring to FIGS. 5 and 6, FIG. 5 is a schematic diagram illustrating a cross-section view of a back-side illuminated single-photon avalanche diode according to a first embodiment of the present disclosure, and FIG. 6 is a schematic diagram illustrating an operating principle of the back-side illuminated single-photon avalanche diode of FIG. 5. The sidewall reflection wall is a deep trench isolation structure which may comprise a reflective surface. The deep trench isolation structure extends through the silicon detection layer in a vertical direction. Incoming light can be reflected back and forth by the deep trench isolation structure. The deep trench isolation structure includes a sidewall insulating layer and a filled cavity 3 formed by the sidewall insulating layer. The sidewall insulating layer is an oxide layer 2. The filled cavity 3 is filled with silicon oxide, amorphous silicon, polysilicon, or metal. In some embodiments, filled cavity 3 is filled with metal having a relatively good conductivity. In some embodiments, the light-trapping structure disposed on the silicon oxide layer 11 is a diffraction grating light-trapping structure 9 which may be substantially reflective. According to some embodiments, the diffraction grating light-trapping structure 9 is a shallow trench structure. In addition, the first type doped region 6 is disposed on the silicon oxide layer 11, and the diffraction grating light-trapping structure 9 is disposed in the first type doped region 6. The back-side illuminated SPAD also includes a light-trapping structure (e.g., the inverted pyramid structures 1) on its upper surface, the light-trapping structure on the upper surface and the light-trapping structure (e.g., the diffraction grating light-trapping structure 9) disposed on the silicon oxide layer 11 constitute a composite light-trapping structure. In fact, the inverted pyramid structures 1 disposed on the upper surface of the SPAD can form a gently gradient change in refractive index between the air and the silicon layer, which greatly reduces the high reflectivity originally caused by the abrupt change in refractive index at the interface, allowing more light to enter the back-side illuminated single-photon avalanche diode, which improves the transmittance of the incident light, and plays a role of anti-reflection. This characteristic is broadband and does not target a specific wavelength. Meanwhile, when the incident light passes through the inverted pyramid structures 1 on the upper surface, the incident light is dispersed to various angles by means of reflection, scattering, refraction, and the like, so that the effective optical path of the light in the detector is increased, which plays a role of light-trapping, thereby improving the absorption efficiency of the light in the back-side illuminated single-photon avalanche diode. A light-trapping structure which is substantially a diffraction grating, that is, the diffraction grating light-trapping structure 9, is formed on the lower surface of the back-side illuminated SPAD, so that the vertically incident light can be diffracted to a certain angle, and in combination with the reflection effect of the deep trench isolation structure, the light ray is reflected back and forth in the silicon layer, thereby further improving the light absorption efficiency of the SPAD. In some embodiments, part of the incident light vertically entering the back-side illuminated single-photon avalanche diode may interact with the diffraction grating light-trapping structure 9 to generate a diffracted light which has a horizontal component, and is reflected by the deep trench isolation structure so that the light ray is reflected back and forth in a silicon base of the SPAD, thereby increasing the effective optical path and increasing the absorption rate. In this way, theoretically speaking, the absorption rate of the light in the silicon layer can approach its theoretical limit value, i.e., Yablonovitch limit. The back-side illuminated SPAD being provided with the composite light-trapping structure can further effectively improve the light absorption efficiency. Referring to FIG. 7, FIG. 7 is a schematic diagram illustrating photon detection efficiencies with and without a light-trapping structure. By simulation, the absorption efficiencies of the SPAD unit with or without the light-trapping structure can be calculated. As shown in FIG. 7 that, the back-side illuminated single-photon avalanche diode without the composite light-trapping structure has an absorption efficiency in a range from 5% to 20% at 850 nm to 960 nm band, and has an absorption efficiency of about 15% at 905 nm wavelength which is important in the application. In comparison, the back-side illuminated single-photon avalanche diode with the composite light-trapping structure (as shown in FIG. 5) has an absorption efficiency significantly improved as a whole for light at 850 to 960 nm wavelengths, and has an absorption efficiency significantly improved to 38% at 905 nm wavelength, which is significantly improved compared to the absorption efficiency of the back-side illuminated single-photon avalanche diode without the light-trapping structure.

Figure 8:
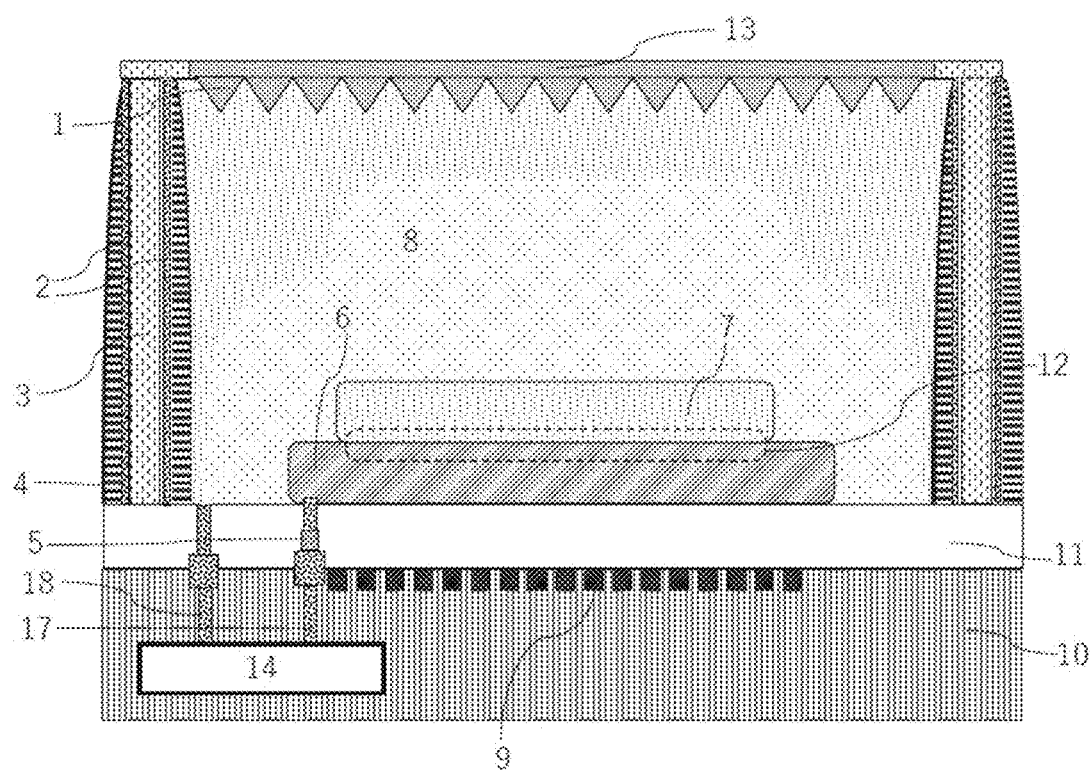
FIG. 8 is a schematic diagram illustrating a cross-section of a back-side illuminated single-photon avalanche diode according to a second embodiment of the present disclosure.
Figure 9:
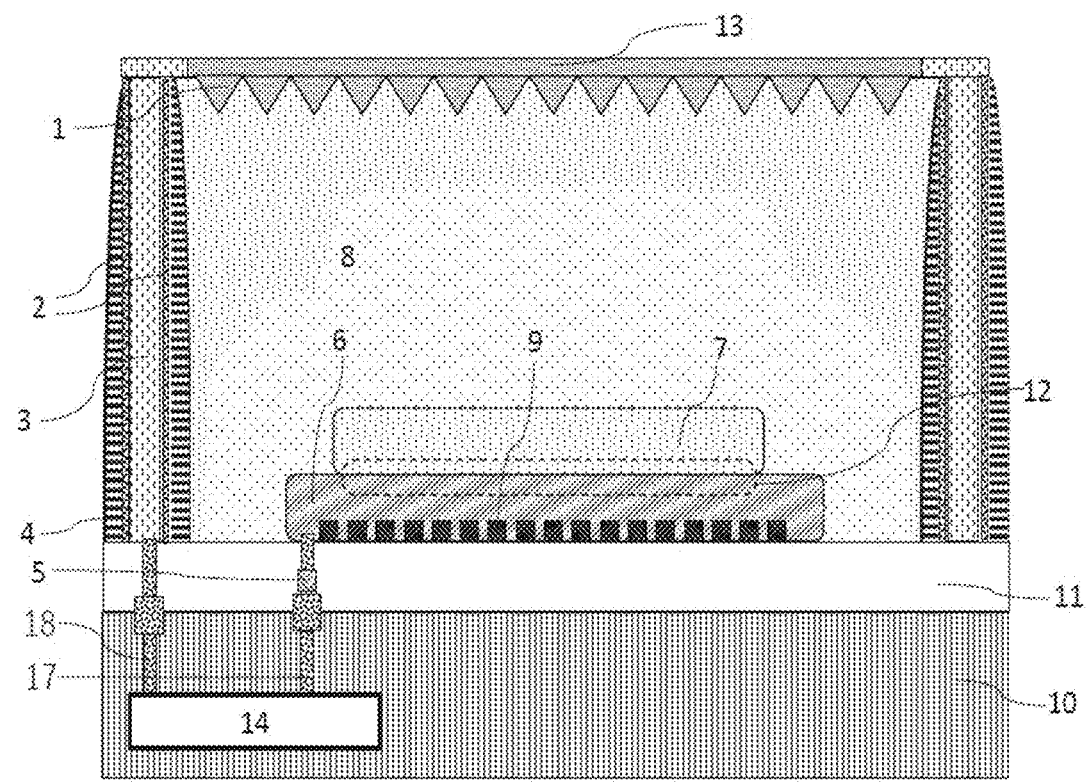
FIG. 9 is a schematic diagram illustrating a cross-section of a deep trench isolation structure of an image sensor according to a specific embodiment of the present disclosure.

Referring to FIG. 8, FIG. 8 is a schematic diagram illustrating a cross-section view of a back-side illuminated single-photon avalanche diode according to a second embodiment of the present disclosure. The light-trapping structure (the diffraction grating light-trapping structure 9 as shown in FIG. 8) may also be formed below the silicon oxide layer 11, and in theory, it can also play a role of light-trapping to enhance the absorption efficiency. In FIG. 8, an inverted pyramid structure 1 is further disposed on the upper surface of the SPAD, and the light-trapping effect is improved by having both the upper and lower light-trapping structures. Further, referring to FIGS. 5 and 8, the back-side illuminated single-photon avalanche diode further includes at least two external electrodes for reading out signals and/or applying voltages, and the external electrodes are connected to the silicon detection layer. In this embodiment, the back-side illuminated single-photon avalanche diode includes a contact structure which may comprise: a first external electrode 17, a second external electrode 18, and a quenching resistor 5. The first external electrode 17 is electrically connected to the first type doped region 6 through the quenching resistor 5, and the second external electrode 18 is electrically connected to the third type doped region 8. Alternatively, the first external electrode 17 is electrically connected to the third type doped region 8 through the quenching resistor 5, and the second external electrode 18 is electrically connected to the first type doped region 6. In addition, the quenching resistor 5 may also be connected to the second external electrode 18, the first external electrode 17 is electrically connected to the first type doped region 6, and the second external electrode 18 is electrically connected to the third type doped region 8 through the quenching resistor 5. Alternatively, the first external electrode 17 is electrically connected to the third type doped region 8, and the second external electrode 18 is electrically connected to the first type doped region 6 through the quenching resistor 5. Referring to FIG. 9, FIG. 9 is a schematic diagram illustrating a cross-section view of a deep trench isolation structure of an image sensor according to a specific embodiment of the present disclosure. When the deep trench isolation structure is filled with conductive amorphous silicon, polysilicon, or metal, the first external electrode 17 of the back-side illuminated single-photon avalanche diode is electrically connected to the first type doped region 6 through the quenching resistor 5, and the second external electrode 18 thereof is electrically connected to the deep trench isolation structure. Alternatively, the first external electrode 17 is electrically connected to the deep trench isolation structure through the quenching resistor 5, and the second external electrode 18 is electrically connected to the first type doped region 6. Similarly, the quenching resistor 5 may also be connected to the second external electrode 18, the first external electrode 17 is electrically connected to the first type doped region 6, and the second external electrode 18 is electrically connected to deep trench isolation structure through the quenching resistor 5. Alternatively, the first external electrode 17 is electrically connected to the deep trench isolation structure, and the second external electrode 18 is electrically connected to the first type doped region 6 through the quenching resistor 5.

Example Three

Figure 10:
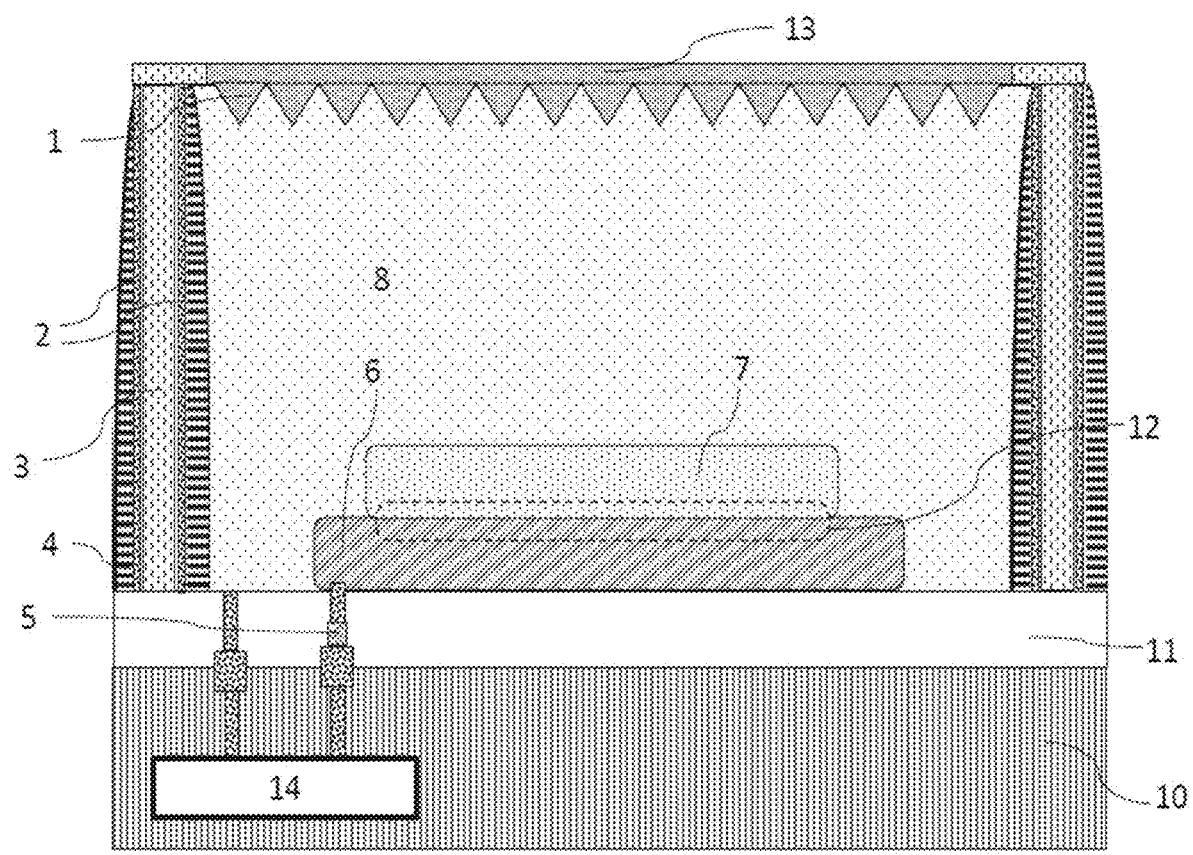
FIG. 10 is a schematic diagram illustrating a cross-section of a back-side illuminated single-photon avalanche diode according to a third embodiment of the present disclosure.
Figure 11:
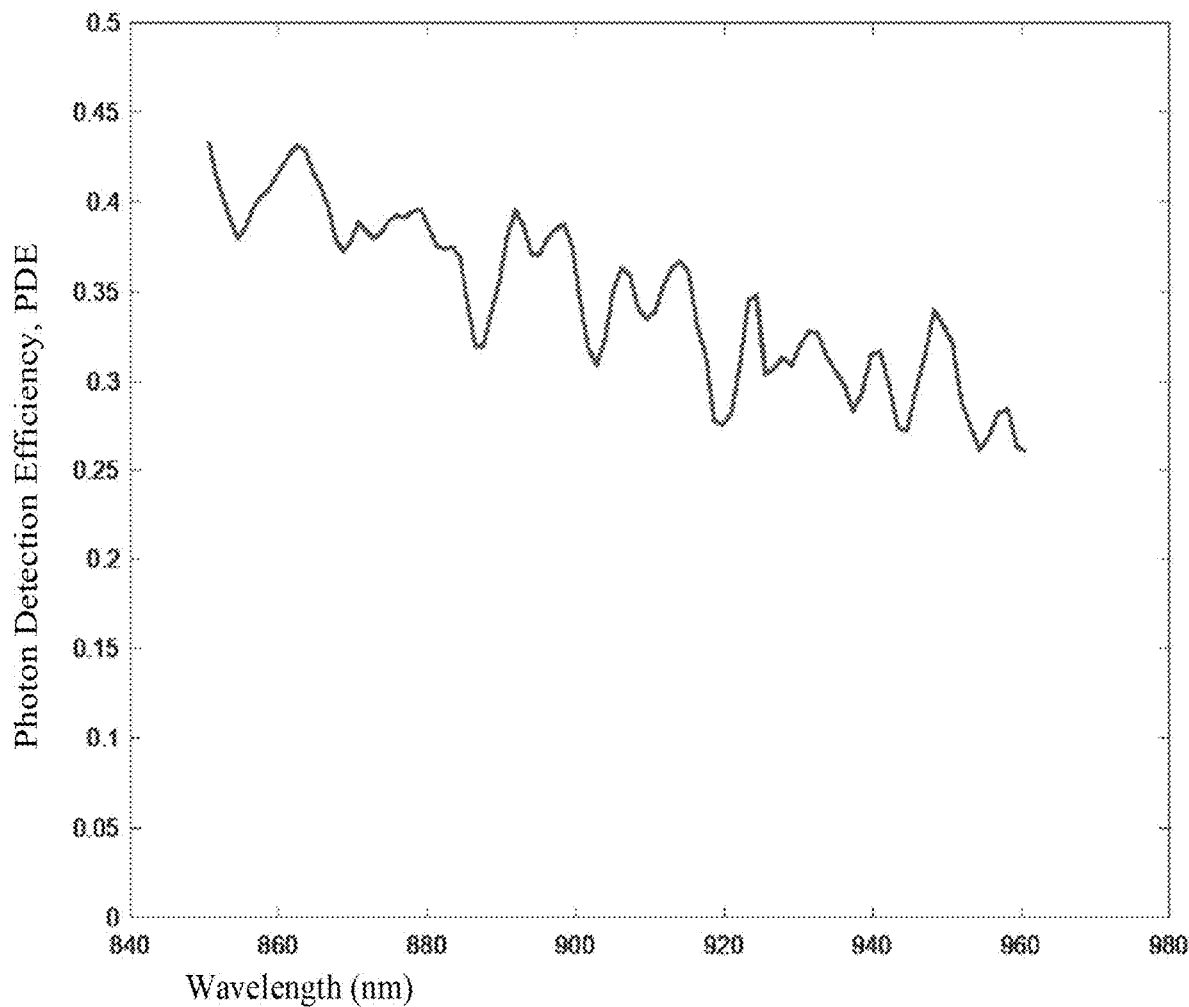
FIG. 11 is a schematic diagram illustrating a photon detection efficiency of a back-side illuminated single-photon avalanche diode according to a specific embodiment of the present disclosure.

An improvement has been further made based on Example One to obtain Example Three. Referring to FIG. 10, FIG. 10 is a schematic diagram illustrating a cross-section view of a back-side illuminated single-photon avalanche diode according to a third embodiment of the present disclosure. The light-trapping structure and/or the anti-reflection structure are inverted pyramid structures 1. The inverted pyramid structures 1 have both light-trapping and anti-reflection functions. Specifically, the inverted pyramid structures 1 are disposed on an upper surface of the back-side illuminated SPAD (that is, disposed above the third type doped region 8), and the inverted pyramid structures 1 are formed by filling silicon oxide after etching on a silicon substrate. In some embodiments, an insulating medium protective layer 13 is disposed on the inverted pyramid structures 1 to protect the SPAD. Specifically, the inverted pyramid structures 1 disposed on the upper surface of the SPAD can form a gently gradient change in refractive index between the air and the silicon layer, which greatly reduces the high reflectivity originally caused by the abrupt change in refractive index at the interface, allowing more light to enter the back-side illuminated single-photon avalanche diode, which improves the transmittance of the incident light, and plays a role of anti-reflection. This characteristic is broadband and does not target a specific wavelength. Meanwhile, when the incident light passes through the inverted pyramid structures 1 on the upper surface, the incident light is dispersed to various angles by means of reflection, scattering, refraction, and the like, so that the effective optical path of the light in the detector is increased, which plays a role of light-trapping, thereby improving the absorption efficiency of the light in the back-side illuminated single-photon avalanche diode. Referring to FIG. 10, a schematic diagram of photon detection efficiency (PDE) of FIG. 11 is obtained by simulation. It can be seen from the result of the simulation that, by disposing the inverted pyramid structures 1 on the upper surface, the SPAD has excellent light absorption efficiency, and the light absorption efficiency is generally 0.25 or greater.

Example Four

Figure 14:
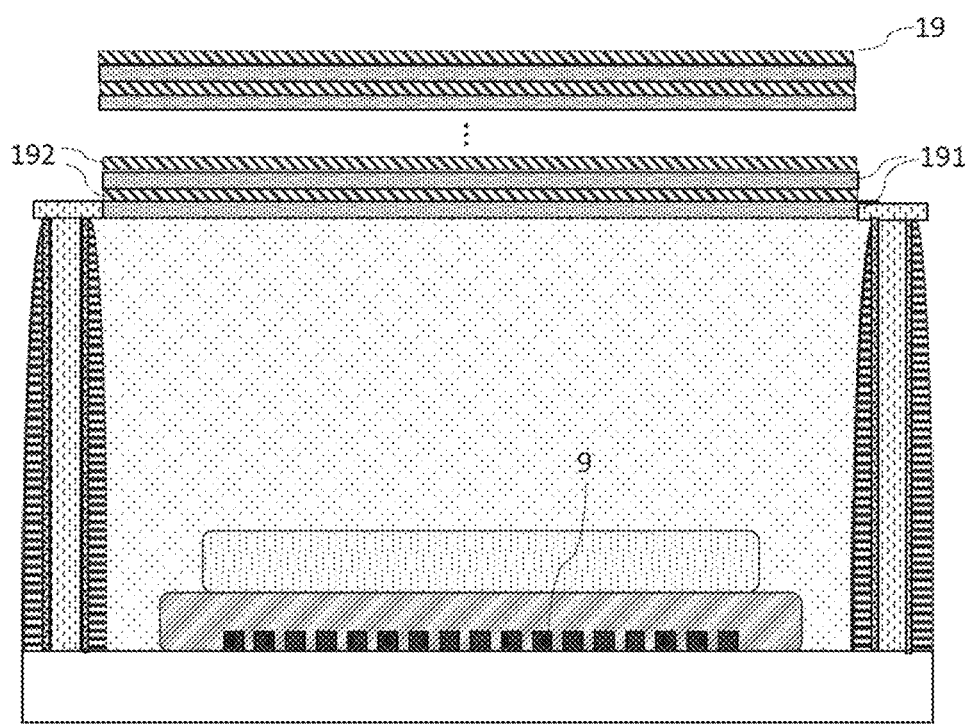
FIG. 14 is a schematic diagram illustrating a cross-section of an anti-reflection structure of a back-side illuminated single-photon avalanche diode according to a specific embodiment of the present disclosure.
Figure 15:
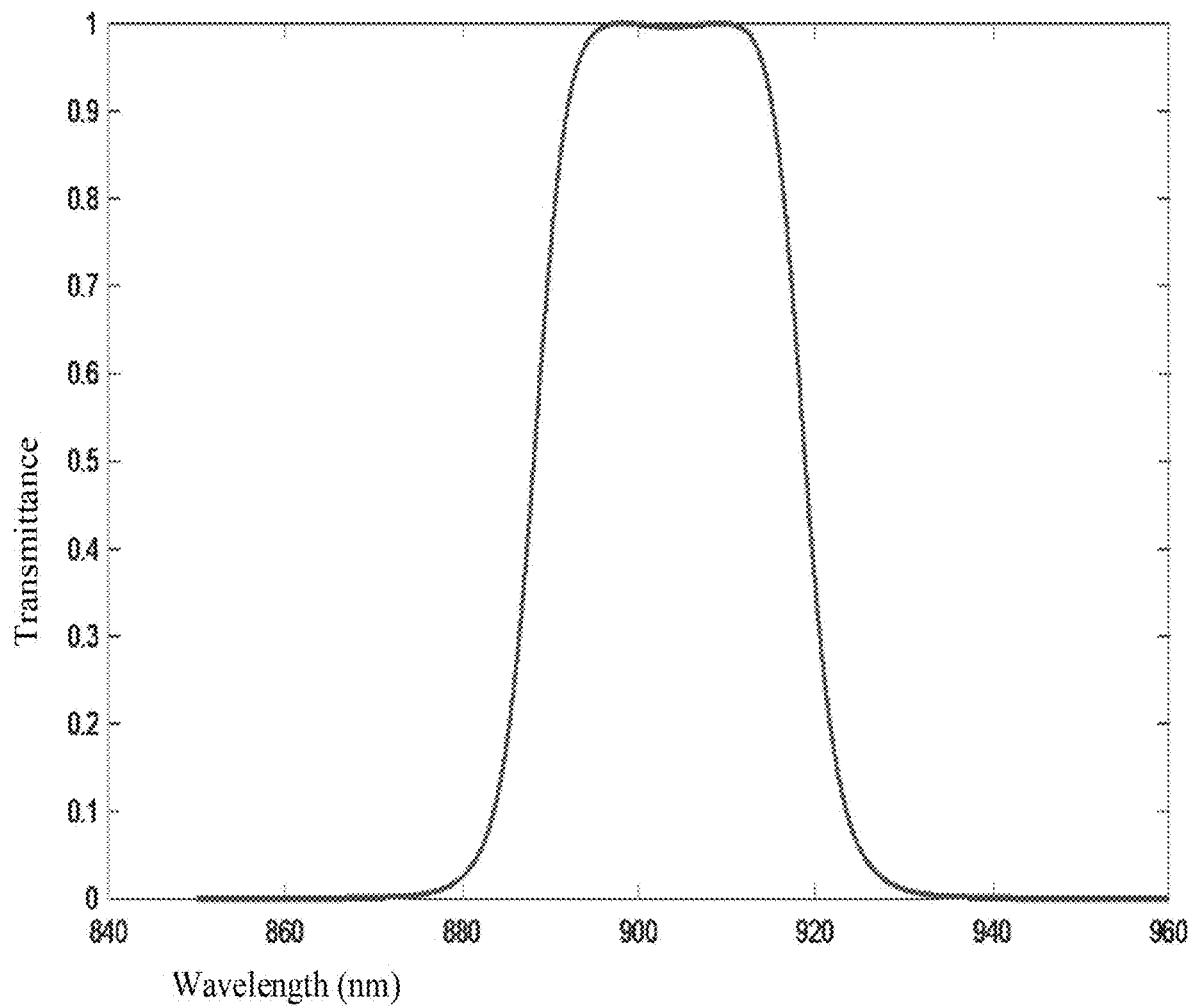
FIG. 15 is a schematic diagram illustrating a transmittance of the anti-reflection structure of FIG. 14 for a normal incident light ray.
Figure 16:
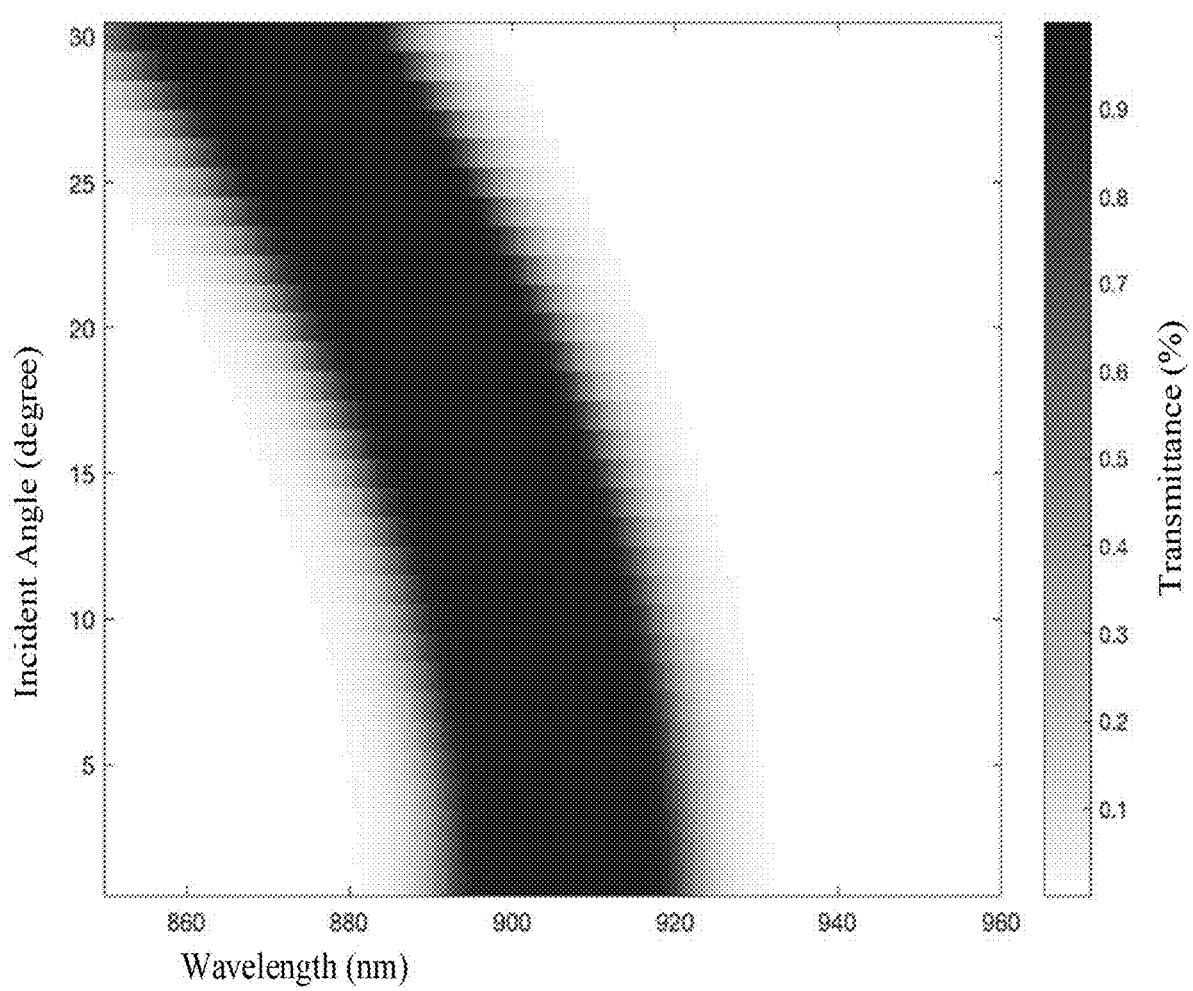
FIG. 16 is a schematic diagram illustrating transmittances of the anti-reflection structure of FIG. 14 for light rays with different incident angles.
Figure 17:
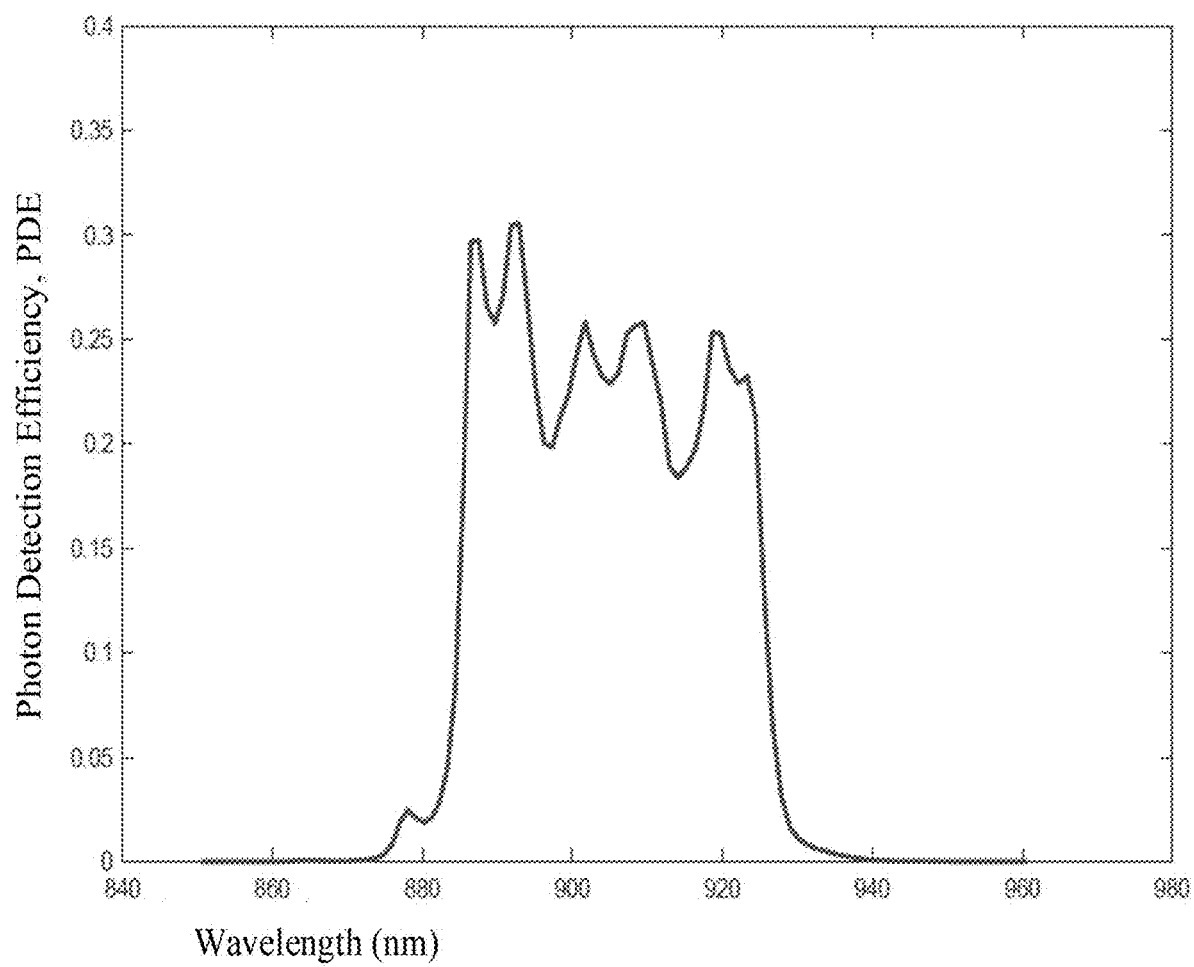
FIG. 17 is a schematic diagram illustrating a photon detection efficiency of the anti-reflection structure of FIG. 14.

An improvement is further made based on Example One to obtain Example Four. The anti-reflection structure is a film structure disposed above the silicon detection layer, and the film structure includes at least two types of films having different refractive indices. In fact, the anti-reflection structure is an anti-reflection film (also known as anti-reflection coating) having an excellent anti-reflection effect obtained by plating a plurality of layers of materials having different refractive indices on an upper surface of the BSI SPAD so that light absorption can be increased. The anti-reflection film achieves a transmittance close to 100% for incident light at a specific wavelength band, and completely reflects incident light outside the specific wavelength band. Referring to FIG. 14, FIG. 14 is a schematic diagram illustrating a cross-section view of an anti-reflection structure of a back-side illuminated single-photon avalanche diode according to a specific embodiment of the present disclosure. The anti-reflection film 19 includes two types of film materials having different refractive indices (that is, a first type film material 191 and a second type film material 192), the first type film material 191 is silicon dioxide, and the second type film material 192 is silicon nitride. A light transmittance and a photon detection efficiency of the anti-reflection film 19 are shown in FIGS. 15, 16, and 17, from which can be seen that the anti-reflection structure of FIG. 14 is highly selective to the wavelength of the incident light. As shown in FIG. 15, at 890 nm to 910 nm, the transmittance can be close to 1, and for the incident light outside this range, the transmittance is close to 0. This feature can effectively reduce the noise caused by the ambient background light. The response characteristics of the anti-reflection film to lights with different wavelengths and different incident angles are different, and the result of the simulation is shown in FIG. 16. For incident light with a wavelength at around 905 nm, when its incident angle is larger than 20 degree, the transmittance of the anti-reflection film decreases sharply from a level close to 100%/6 to 10%/o or less, from which can be seen that the anti-reflection film is highly selective to the incident angle of the incident light. In SPAD, when light having a horizontal direction component generated by diffraction of the bottom light-trapping structure is incident on the upper surface from below, the light will be reflected back into the silicon layer due to that the incident angle is relatively large (>45'), thereby improving the light absorption efficiency. As shown in FIG. 14, the back-side illuminated single-photon avalanche diode may be provided with both the anti-reflection structure on the upper surface (that is, the anti-reflection film 19) and the light-trapping structure on the lower surface (that is, the diffraction grating light-trapping structure 9) to more effectively improve the light absorption efficiency of the BSI SPAD. The anti-reflection structure disposed on the upper surface of the SPAD may also be combined with the light-trapping structure (that is, the inverted pyramid structures) disposed on the upper surface of the SPAD to improve the light absorption efficiency of the back-side illuminated SPAD.

Example Five

Figure 18:
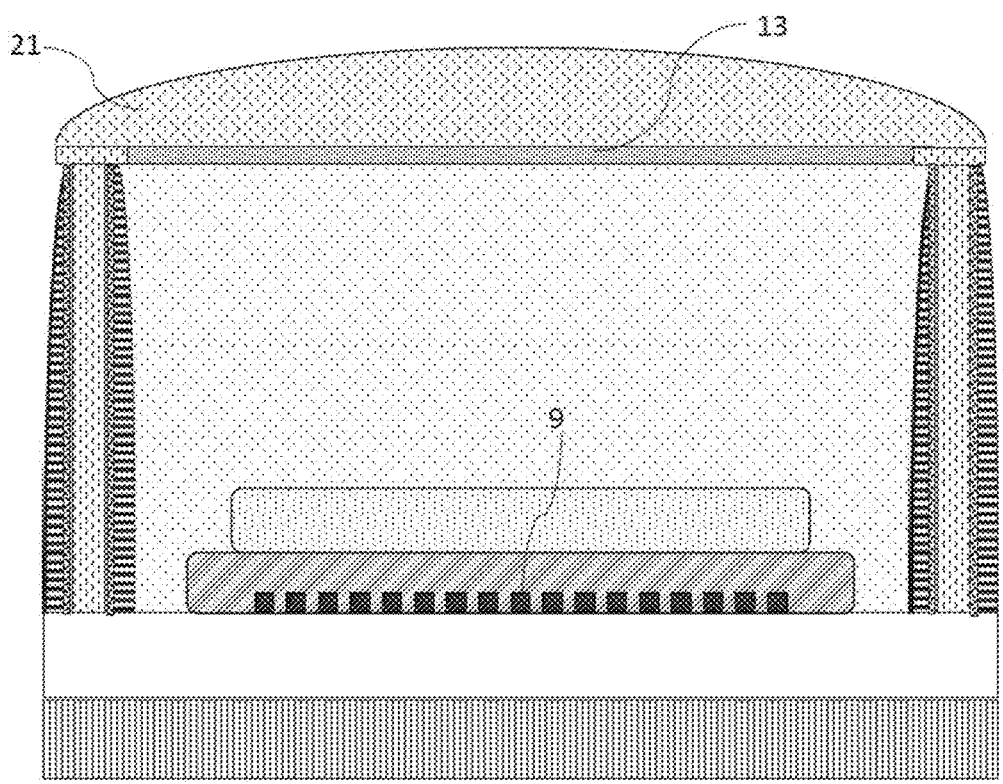
FIG. 18 is a schematic diagram illustrating a cross-section of a back-side illuminated single-photon avalanche diode according to a fourth embodiment of the present disclosure.
Figure 19:
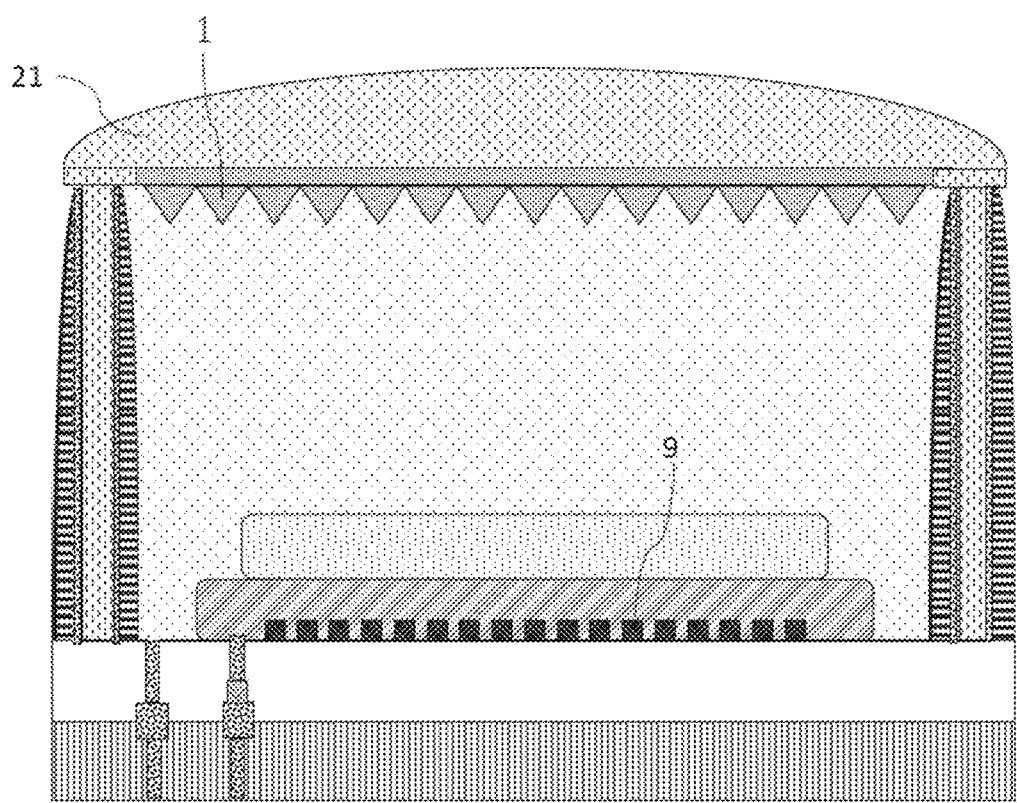
FIG. 19 is a schematic diagram illustrating a cross-section of a back-side illuminated single-photon avalanche diode according to a fifth embodiment of the present disclosure.

Referring to FIG. 18, FIG. 18 is a schematic diagram illustrating a cross-section view of a back-side illuminated single-photon avalanche diode according to a fourth embodiment of the present disclosure. The back-side illuminated single-photon avalanche diode further includes a microlens 21 disposed on the silicon detection layer. In this example, an insulating medium protective layer 13 is further disposed on the silicon detection layer, and a microlens 21 is added onto the insulating medium protective layer 13. In addition, in some embodiments, the back-side illuminated single-photon avalanche diode is provided with both the microlens 21 and the diffraction grating light-trapping structure 9 on the lower surface to further improve the light absorption efficiency. By covering the upper surface of the SPAD with the microlens, the collection efficiency of light incident at a large angle is improved, which is equivalent to increasing the filling factor. Referring to FIG. 19, FIG. 19 is a schematic diagram illustrating a cross-section view of a back-side illuminated single-photon avalanche diode according to a fifth embodiment of the present disclosure. By covering the microlens 21 on the SPAD having both the upper and lower light-trapping structures (that is, the inverted pyramid structures 1 and the diffraction grating light-trapping structure 9), the collection efficiency of light incident at a large angle can be further improved.

Example Six

Referring to FIGS. 5, 8, and 12, a second type doped region 7 is disposed on a first type doped region 6, a third type doped region 8 includes the second type doped region 7, and a doping concentration of the third type doped region 8 gradually increases from bottom to top. More specifically, the second type doped region 7 is disposed in the middle of or below the middle of the third type doped region 8, that is, the second type doped region 7 is located below the center of the third type doped region 8. By optimizing the design of the doping distribution, the detection efficiency of the back-side illuminated SPAD can be further improved. As shown in FIG. 5, the doping concentration of the third type doped region 8 in the vicinity of the SPAD junction 12 (also known as multiplication region or avalanche region) of the SPAD (as shown in the dashed box in FIG. 5) is relatively low. By such doping distribution, the width of a guard ring can be reduced, and absorption photo-generated carriers at various locations are collected to the avalanche region, thereby improving the detection efficiency of the photosensitive region of the SPAD. The guard ring refers to a region surrounding the avalanche region in the SPAD, which can prevent the avalanche from occurring at the edge (may also be referred to as "edge breakdown"). However, too large a guard ring reduces the filling factor of SPAD.

In summary, since the BSI SPAD of the present disclosure is disposed with an anti-reflection structure, a microlens, and light-trapping structures on the upper and lower surfaces, the BSI SPAD has a high tolerance for unavoidable deviations in processing thickness, temperature, wavelength, and incident angle in practice, and is more suitable for the operating environment and actual use condition of a SPAD-based system (such as a lidar).

Example Seven

Referring to the above-described examples, in some embodiments, a photoelectric detector array includes a plurality of the above-mentioned back-side illuminated single-photon avalanche diodes distributed in an array, and the photoelectric detector array includes an SiPM or SPAD array. Since the back-side illuminated SPAD is provided with a light-trapping structure, an anti-reflection structure, a microlens, and the like to improve the light absorption efficiency of the back-side illuminated SPAD, and a deep trench isolation structure is further disposed between the back-side illuminated SPAD to avoid crosstalk, the performance of the system in which the photoelectric detector array is located can be improved. For example, for a lidar based on the SiPM/SPAD array, on the one hand, the signal-to-noise ratio is improved (the light absorption efficiency is improved, and the signal is enhanced; and the crosstalk is weakened, and the noise is reduced), the detection distance of the lidar is increased, and the detection quality is improved. On the other hand, it is ensured that the receiving end of the lidar is low in cost, high in yield, and more easy to mass-produce. The subunit response on the edge would be better. Since a thermal drift may occur to the light source wavelength of the lidar, the absorption efficiency over a wide band of the back-side illuminated SPAD of the present disclosure can be improved, thereby reducing the influence of the light source wavelength drift on the performance of the lidar.

Example Eight

Figure 20:
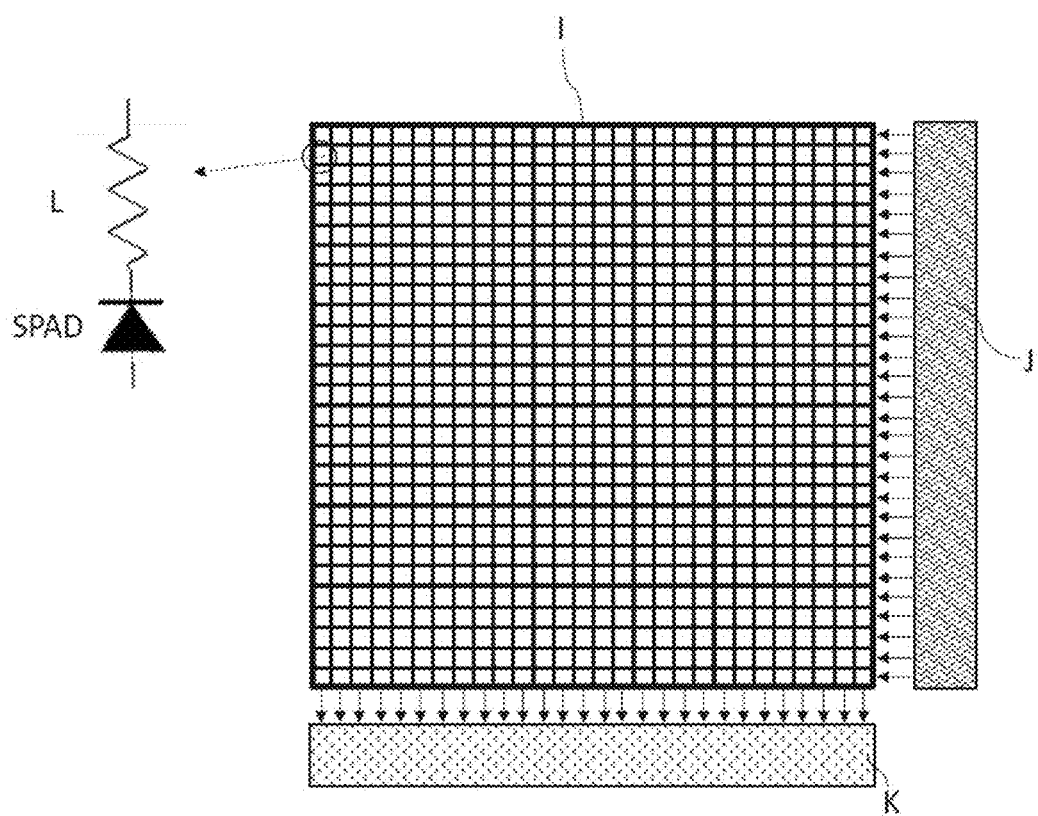
FIG. 20 is a schematic diagram illustrating a structure of an image sensor according to a specific embodiment of the present disclosure.

Referring to FIG. 20, FIG. 20 is a schematic diagram illustrating a structure of an image sensor according to some embodiments of the present disclosure. An image sensor includes a control circuit J, a readout circuit K, and an array made up of a plurality of the back-side illuminated single-photon avalanche diodes, namely a back-side illuminated SPAD array I. The back-side illuminated SPAD array I includes back-side illuminated SPADs distributed in an array, and the back-side illuminated SPAD includes a quenching resistor L. Referring to FIG. 5, the back-side illuminated single-photon avalanche diodes are separated from each other by sidewall reflection walls, such as deep trench isolation structures. An output end of the control circuit J is connected to an input end of the back-side illuminated single-photon avalanche diode, and an output end of the back-side illuminated single-photon avalanche diode is connected to an input end of the readout circuit K. The back-side illuminated single-photon avalanche diodes are separated by the deep trench isolation structures, so that crosstalk will not occur between the back-side illuminated single-photon avalanche diodes. According to some embodiments, the back-side illuminated single-photon avalanche diode further includes a fourth type doped region 4, and accordingly, the fourth type doped region 4 may be n++ type doped or p++ type doped. When the first type doped region 6 is an n-type doped region, the fourth type doped region 4 is p++ type doped. When the first type doped region 6 is a p-type doped region, the fourth type doped region 4 is n++ type doped. For an image sensor including the back-side illuminated single-photon avalanche diode, since it has a back-side illuminated single-photon avalanche diode, its light absorption efficiency is improved.

Example Nine

Figure 21:
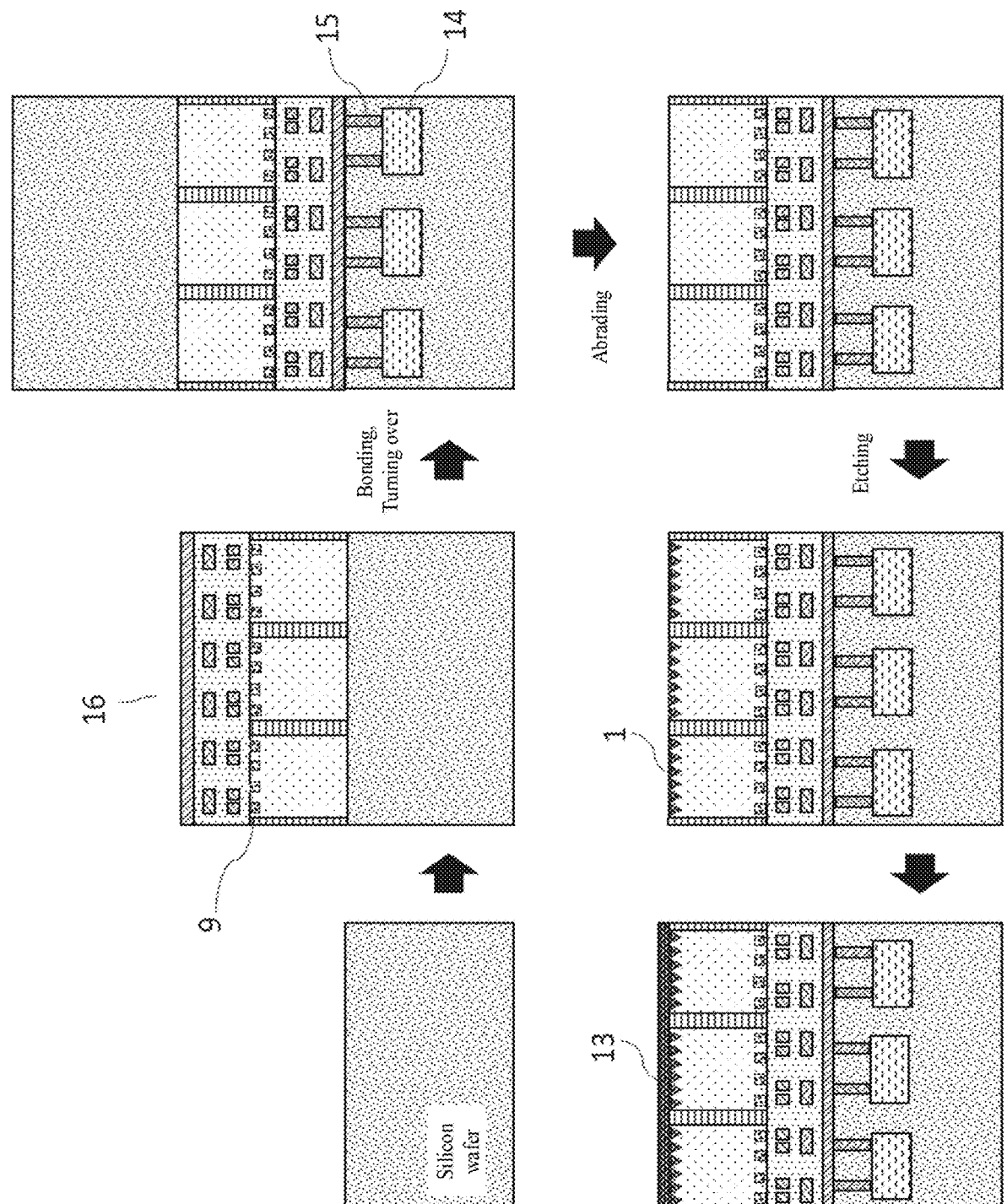
FIG. 21 is a flow diagram illustrating a manufacturing method of a back-side illuminated single-photon avalanche diode according to a specific embodiment of the present disclosure.

A manufacturing method of a back-side illuminated single-photon avalanche diode, which is applied to the described back-side illuminated single-photon avalanche diode, is provided. In some embodiments, a back-side illuminated single-photon avalanche diode having a composite light-trapping structure formed by the inverted pyramid structures on the upper surface and the diffraction grating light-trapping structure on the lower surface is described as an example with reference to FIG. 5. Referring to FIG. 21, FIG. 21 is a flow diagram illustrating a manufacturing method of a back-side illuminated single-photon avalanche diode according to some embodiments of the present disclosure. The method includes the following steps.

First, a photodiode is manufactured on an epitaxially grown silicon wafer by a conventional process of SPAD to obtain a first wafer 16, and a first light-trapping structure is disposed on one surface of the photodiode. In some embodiments, the first light-trapping structure is manufactured on an upper surface of the photodiode (that is, above the silicon oxide layer), and the first light-trapping structure is configured as a diffraction grating light-trapping structure 9.

Next, the surface of the first wafer 16 close to the photodiode and the surface of the second wafer close to the external circuit 14 are aligned and bonded at a low temperature. The external circuit 14 is disposed in the second wafer. The external circuit 14 includes a bias supply circuit or a signal processing circuit. The alignment can be performed mechanically or optically, and the bonding can be performed by a polymer adhesive or an oxide. The bonded wafer is turned over so that the silicon wafer of the first wafer 16 is positioned on an upper side, as shown in the third picture in FIG. 21.

The silicon wafer of the first wafer 16 is then abraded and etched to reduce its thickness. In some embodiments, the silicon wafer originally about 1 mm thick is abraded to about 50 um by mechanical abrading, and the thickness thereof is then reduced to 5 um by chemical etching.

A second light-trapping structure is then manufactured on the silicon wafer of the first wafer 16. In some embodiments, the second light-trapping structure is configured as inverted pyramid structures 1.

Finally, an insulating medium protective layer 13 is plated on the inverted pyramid structures 1.

The manufacturing method of a back-side illuminated single-photon avalanche diode achieves the manufacturing of the back-side illuminated single-photon avalanche diode. The manufacturing method is simple. The thickness of a silicon layer does not need to be increased, and therefore the processing difficulty is not increased. The back-side illuminated single-photon avalanche diode has a composite light-trapping structure consisting of a first light-trapping structure and a second light-trapping structure, which can improve the light absorption efficiency of the back-side illuminated single-photon avalanche diode.

It should be noted that a manufacturing method of a back-side illuminated single-photon avalanche diode having other light-trapping structures may refer to the manufacturing method described in this example. For example, for micro-lens, the back-side illuminated single-photon avalanche diode may be coated with an insulating medium protective layer, and then the micro-lens may be added onto the insulating medium protective layer.

The preferred embodiments of the present disclosure have been described above, but the disclosure is not limited to the described embodiments, and those skilled in the art may make various equivalents or substitutions without departing from the spirit of the present disclosure, these equivalent variations or substitutions are included within the scope of the claims of this application.

What is claimed is:

1. A back-side illuminated (BSI) single-photon avalanche diode (SPAD) pixel circuit comprising:
   a substrate material;
   a first sidewall structure and a second sidewall structure;
   a diffraction grating structure configured on the substrate material;
   a first doped region overlaying the diffraction grating structure, the first doped region comprising a first top surface region and a second top surface region;
   a second doped region overlaying the first top surface region of the first doped region, the second doped region comprising a third top surface region;
   a third doped region overlaying the second top surface region of the first doped region and the third top surface region of the second doped region, the third doped region being positioned between the first sidewall structure and the second sidewall structure; and a light-trapping structure overlaying the third doped region, the light-trapping structure comprising pyramid structures, the pyramid structures being horizontally aligned.

2. The circuit of claim 1 wherein the diffraction grating structure is configured to increase reflection of light wavelengths between 850 nm and 960 nm.

3. The circuit of claim 1 wherein the first doped region is characterized by a larger surface than the second doped region.

4. The circuit of claim 1 wherein the third doped region is characterized by a concentration gradient.

5. The circuit of claim 1 wherein the light-trapping structure comprises an anti-reflection structure configured to increase light absorption.

6. The circuit of claim 1 further comprising a SPAD region configured at a junction between the first doped region and the second doped region.

7. The circuit of claim 1 further comprising a silicon oxide layer configured between the diffraction grating structure and the substrate material.

8. The circuit of claim 1 further comprising a silicon oxide layer configured between the diffraction grating structure and the first doped region.

9. The circuit of claim 1 wherein the diffraction grating structure is substantially reflective.

10. The circuit of claim 1 wherein the light-trapping structure comprises diffraction grating elements.

11. The circuit of claim 1 wherein the first sidewall structure comprises a deep trench isolation structure.

12. The circuit of claim 1 wherein the first sidewall structure comprises a reflective surface.

13. The circuit of claim 1 further comprising a contact structure and a circuit layer configured within the substrate material.

14. A back-side illuminated (BSI) single-photon avalanche diode (SPAD) pixel circuit comprising:

a substrate material;

a first sidewall structure;

a diffraction grating structure configured on the substrate material;

a silicon oxide layer coupled to the diffraction grating structure;

a first doped region overlaying the diffraction grating structure, the first doped region comprising a first top surface region and a second top surface region;

a second doped region overlaying the first top surface region of the first doped region, the second doped region comprising a third top surface region;

a third doped region overlaying the second top surface region of the first doped region and the third top surface region of the second doped region; and a light-trapping structure overlaying the third doped region, the light-trapping structure comprising pyramid structures, the pyramid structures being horizontally aligned.

15. The circuit of claim 14, further comprising a SPAD region configured at a junction between the first doped region and the second doped region.

16. The circuit of claim 14 wherein the first sidewall structure comprises a deep trench isolation structure.

17. The circuit of claim 14 wherein the first sidewall structure is substantially reflective.

* * * * *